United States Patent
Yoo et al.

(10) Patent No.: US 11,664,291 B2
(45) Date of Patent: *May 30, 2023

(54) SEMICONDUCTOR ASSEMBLIES INCLUDING VERTICALLY INTEGRATED CIRCUITS AND METHODS OF MANUFACTURING THE SAME

(71) Applicant: Micron Technology, Inc., Boise, ID (US)

(72) Inventors: Chan H. Yoo, Boise, ID (US); Owen R. Fay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/115,716

(22) Filed: Dec. 8, 2020

(65) Prior Publication Data

US 2021/0090969 A1   Mar. 25, 2021

Related U.S. Application Data

(63) Continuation of application No. 16/503,363, filed on Jul. 3, 2019, now Pat. No. 10,872,835.

(51) Int. Cl.
*H01L 23/36* (2006.01)
*H01L 23/42* (2006.01)
(Continued)

(52) U.S. Cl.
CPC .............. *H01L 23/36* (2013.01); *H01L 23/42* (2013.01); *H01L 23/49822* (2013.01);
(Continued)

(58) Field of Classification Search
CPC ... H01L 23/36; H01L 23/42; H01L 23/49822; H01L 24/73; H01L 24/33; H01L 25/0657;
(Continued)

(56) References Cited

U.S. PATENT DOCUMENTS 8,704,352 B2    4/2014   Hisano et al.
9,287,240 B2    3/2016   Li et al.
(Continued)

FOREIGN PATENT DOCUMENTS

CN    101645453 A    2/2010
CN    102498566 A    6/2012
(Continued)

OTHER PUBLICATIONS

CN Patent Application No. 202010610562.3—Chinese Office Action and Search Report, dated Jun. 4, 2021, with English Translation, 16 pages.
(Continued)

*Primary Examiner* — Dao H Nguyen
(74) *Attorney, Agent, or Firm* — Perkins Coie LLP

(57) ABSTRACT

Semiconductor assemblies including thermal management configurations for reducing heat transfer between overlapping devices and associated systems and methods are disclosed herein. A semiconductor assembly may comprise a first device and a second device with a thermally conductive layer, a thermal-insulator interposer, or a combination thereof disposed between the first and second devices. The thermally conductive layer and/or the thermal-insulator interposer may be configured to reduce heat transfer between the first and second devices.

19 Claims, 6 Drawing Sheets

(51) Int. Cl.
  *H01L 23/498* (2006.01)
  *H01L 25/10* (2006.01)
  *H01L 25/00* (2006.01)
  *H01L 23/00* (2006.01)
  *H01L 25/065* (2006.01)
  *H05K 7/20* (2006.01)

(52) U.S. Cl.
  CPC .......... *H01L 24/73* (2013.01); *H01L 25/0657* (2013.01); *H01L 25/105* (2013.01); *H01L 25/50* (2013.01); *H05K 7/2039* (2013.01); *H01L 2224/73204* (2013.01); *H01L 2225/107* (2013.01); *H01L 2225/1094* (2013.01); *H01L 2924/1431* (2013.01); *H01L 2924/1434* (2013.01); *H05K 2201/10378* (2013.01)

(58) Field of Classification Search
  CPC .................. H01L 25/105; H01L 15/50; H01L 2224/73204; H01L 2225/107; H01L 2225/1094; H01L 2225/06506; H01L 2225/06589; H01L 2924/1431; H01L 2924/1434; H05K 7/2039; H05K 2201/10378
  USPC ........................................................ 257/706
  See application file for complete search history.

(56) References Cited

U.S. PATENT DOCUMENTS

| | | | | |
|---|---|---|---|---|
| 9,711,433 | B2* | 7/2017 | Taniguchi | H01L 23/473 |
| 10,872,835 | B1* | 12/2020 | Yoo | H05K 7/2039 |
| 2009/0127538 | A1 | 5/2009 | Ryoo et al. | |
| 2010/0032637 | A1 | 2/2010 | Kinoshita et al. | |
| 2010/0171213 | A1 | 7/2010 | Hisano et al. | |
| 2011/0068313 | A1 | 3/2011 | Liu | |
| 2012/0119346 | A1 | 5/2012 | Im et al. | |
| 2013/0058067 | A1* | 3/2013 | Yee | H01L 23/5389 361/820 |
| 2013/0119527 | A1 | 5/2013 | Luo et al. | |
| 2013/0119528 | A1 | 5/2013 | Groothuis et al. | |
| 2014/0131847 | A1 | 5/2014 | Yee et al. | |
| 2014/0362552 | A1* | 12/2014 | Murayama | H05K 1/0203 361/783 |
| 2014/0376189 | A1* | 12/2014 | Sakaguchi | H01L 23/473 361/719 |
| 2015/0279431 | A1 | 10/2015 | Li et al. | |
| 2018/0076112 | A1* | 3/2018 | Dabral | H01L 23/28 |
| 2018/0320984 | A1 | 11/2018 | Lewis et al. | |
| 2019/0198489 | A1* | 6/2019 | Kim | H05K 1/181 |
| 2020/0075545 | A1* | 3/2020 | Kim | H01L 21/561 |

FOREIGN PATENT DOCUMENTS

| | | |
|---|---|---|
| CN | 102573279 A | 7/2012 |
| CN | 103811356 A | 5/2014 |
| CN | 103811436 A | 5/2014 |
| CN | 103975428 A | 8/2014 |
| CN | 103988296 A | 8/2014 |
| CN | 105051891 A | 11/2015 |
| CN | 106463469 A | 2/2017 |
| CN | 108074874 A | 5/2018 |

OTHER PUBLICATIONS

CN Patent Application No. 202010610562.3—Chinese Office Action and Search Report, dated Apr. 28, 2022, with English Translation, 18 pages.
"Civil Engineering Material", edited by Boyu, Niu et al., China Quality Inspection Press, Beijing, Jan. 2019, with Machine Translation, 24 pages.
"New Building Materials and Their Applications", Edited by Kehui, Lin; Guangzhou: South China University of Technology Press, Jan. 2006, 21 pages, with Machine Translation.
Ci Hai, "Revised draft", Science Volume Shanghai People's Publishing House, Jul. 1998, 49 pages, with Machine Translation.
CN Patent Application No. 202010610562.3—Chinese Office Action, dated Nov. 16, 2022, with English Translation, 20 pages.
CN Patent Application No. 202010610562.3—Reexamination Decision, dated Jan. 30, 2023, with English Translation, 36 pages.

* cited by examiner

SEMICONDUCTOR ASSEMBLIES INCLUDING VERTICALLY INTEGRATED CIRCUITS AND METHODS OF MANUFACTURING THE SAME

CROSS-REFERENCE TO RELATED APPLICATION(S)

This application is a continuation of U.S. patent application Ser. No. 16/503,363, filed Jul. 3, 2019; which is incorporated herein by reference in its entirety.

This application contains subject matter related to an U.S. patent application by Chan H. Yoo et al., titled "SEMICONDUCTOR ASSEMBLIES INCLUDING THERMAL CIRCUITS AND METHODS OF MANUFACTURING THE SAME," which is assigned to Micron Technology, Inc., is identified as U.S. patent application Ser. No. 16/503,353, filed on Jul. 3, 2019, and is incorporated herein by reference in its entirety.

TECHNICAL FIELD

The present technology is directed to packaging semiconductor assemblies, such as memory and processors, and several embodiments are directed to semiconductor assemblies that include vertically integrated circuits.

BACKGROUND

The current trend in semiconductor fabrication is to manufacture smaller and faster devices with a higher density of components for computers, cell phones, pagers, personal digital assistants, and many other products. All semiconductor devices generate heat, and dissipating such heat is necessary for optimum and reliable operation of high-performance devices. Moreover, as speed and component density increase, the heat becomes a limiting factor in many products. For example, high performance devices that generate from 80-100 watts may not operate at rated levels or may degrade sufficient heat is dissipated. Accordingly, heat dissipation is a significant design factor for manufacturing microfeature devices.

FIG. 1A is a top view of a conventional semiconductor device assembly 100 ("assembly 100"), and FIG. 1B is a schematic cross-sectional view of the semiconductor device assembly 100 shown in FIG. 1A taken along line 1B-1B of FIG. 1A. Referring to FIGS. 1A and 1B together, the assembly 100 includes a package configured for high-performance operations, such as 3-dimensional graphics processing and/or network processing. As illustrated in FIGS. 1A and 1B, the assembly 100 includes a logic device 102 and a set of memory devices 104 attached to a substrate 106 (e.g., a printed circuit board (PCB)). The logic device 102 includes a graphics processing unit (GPU), and the memory devices 104 generally include high-bandwidth memory (HBM) devices. Details regarding HBM devices are described below.

The assembly 100 includes an interposer 108 (e.g., a silicon interposer) disposed between the devices and the substrate 106. The interposer 108 provides an electrical interface routing between the substrate 102, the logic device 102, the memory devices 104, or a combination thereof. The assembly 100 further includes interface devices 110 disposed between the memory devices 104 and the interposer 108. The interface devices generally include silicon dies configured to facilitate the corresponding memory devices to interface with other devices, such as the GPU.

FIG. 1C illustrates a detailed schematic cross-sectional view of a conventional memory device 124 (e.g., the memory device 104). The memory device 124 includes a stacked package configured to provide high-performance memory (e.g., random access memory (RAM)) interface. The memory device 124 includes memory dies 144 and a storage controller 142 stacked together. One or more of the dies include through silicon vias (TSVs) for electrically coupling two or more dies. The memory device 124 also includes an encapsulant encasing one or more dies.

As shown in FIGS. 1A and 1B, the memory devices 104 and the logic device 102 are horizontally adjacent to each other and horizontally separated. In other words, the memory devices 104 and the logic device 102 are arranged side-by-side, such that the devices do not overlap. The memory devices 104 and the logic device 102 form a layer over the substrate 106. Since heat generally travels upward, the horizontal arrangement of the logic device 102 and the memory devices 104 reduces heat transfer between the devices, such as from the logic device 102 to the memory devices 104. When the logic device 102 is the GPU, it often generates relatively large amounts of thermal energy. As such, existing systems generally do not stack any heat-sensitive devices, such as the memory devices 104, over the GPU. However, the horizontal arrangement drastically increases the overall footprint of the assembly 100.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Several embodiments of semiconductor devices, packages, and/or assemblies in accordance with the present technology can include one or more memory devices mounted over a logic device (e.g., GPU). The vertically stacked structure can include a thermal management configuration to reduce heat transfer between the logic device and the memory devices.

In some embodiments, the vertically stacked structure can include a thermally conductive layer (e.g., graphene structure) on the logic device for laterally (e.g., horizontally) transferring the heat generated by the logic device. A heat spreader can be mounted over the logic device and attached to peripheral portions of the thermally conductive layer. Accordingly, the heat generated by the logic device can be routed around the memory devices via the thermally conductive layer and dissipated over the memory devices using the heat spreader.

In some embodiments, the vertically stacked structure can include a thermal-insulation interposer between the logic device and the memory devices. The thermal-insulation interposer can be configured to reduce transfer of heat between the logic device and the memory devices. In one or more embodiments, the thermal-insulation interposer can include glass, ceramics, or other thermal insulators. In one or more embodiments, the thermal-insulation interposer can include a cavity configured to further reduce the heat transfer. For example, the cavity can maintain a vacuum condition for reducing the heat transfer. Also, the cavity can be filled with phase change material (PCM) that can absorb thermal energy. The PCM can include substances with relatively high heat of fusion that change the physical state (via, e.g., melting, boiling, solidifying, etc.) based on absorbing the thermal energy. Details regarding the thermal management configuration are described below.

Figure 2A:
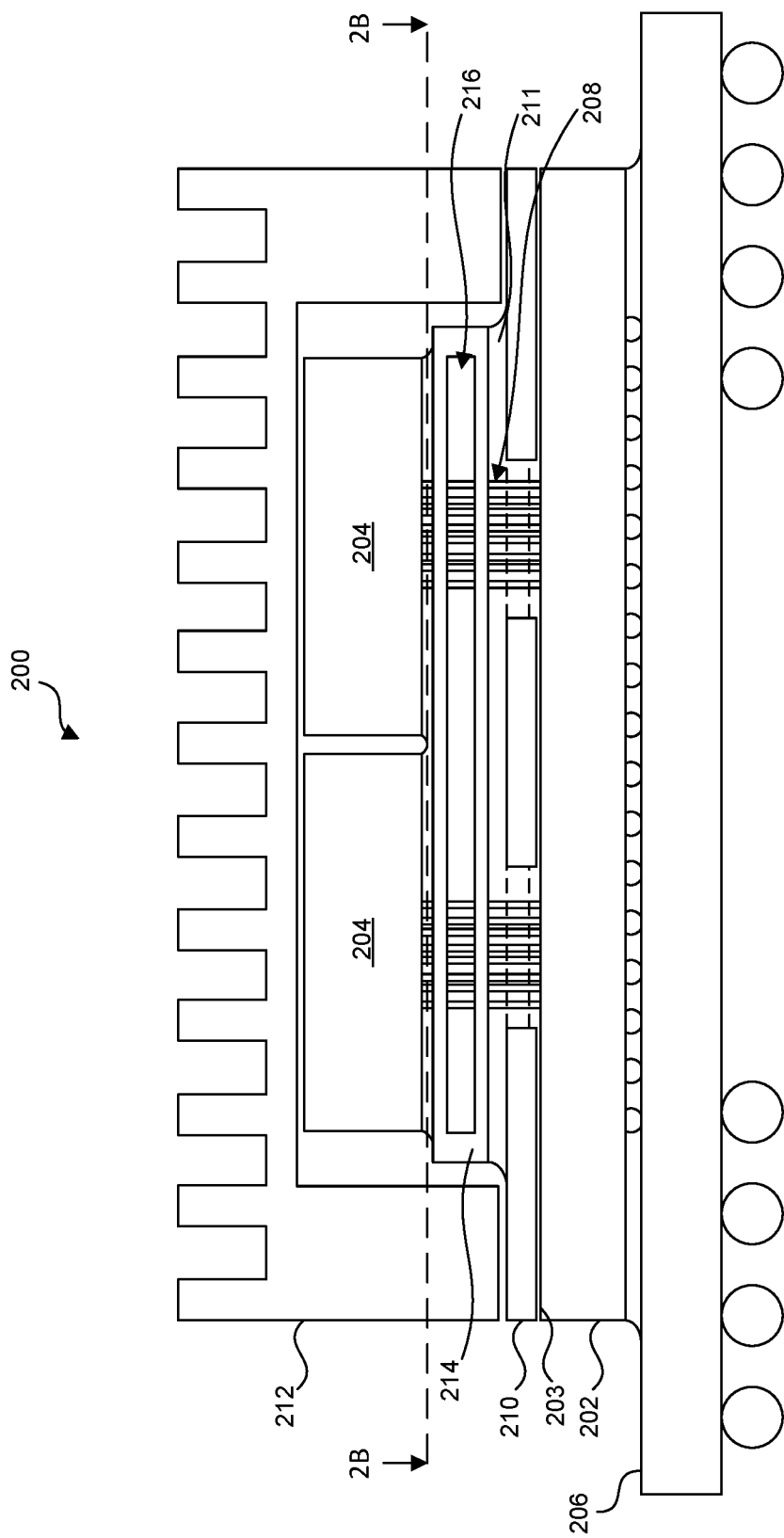
FIG. 2A is a schematic cross-sectional view of a semiconductor device assembly taken along line 2A-2A of FIG. 2B in accordance with embodiments of the technology.
Figure 2B:
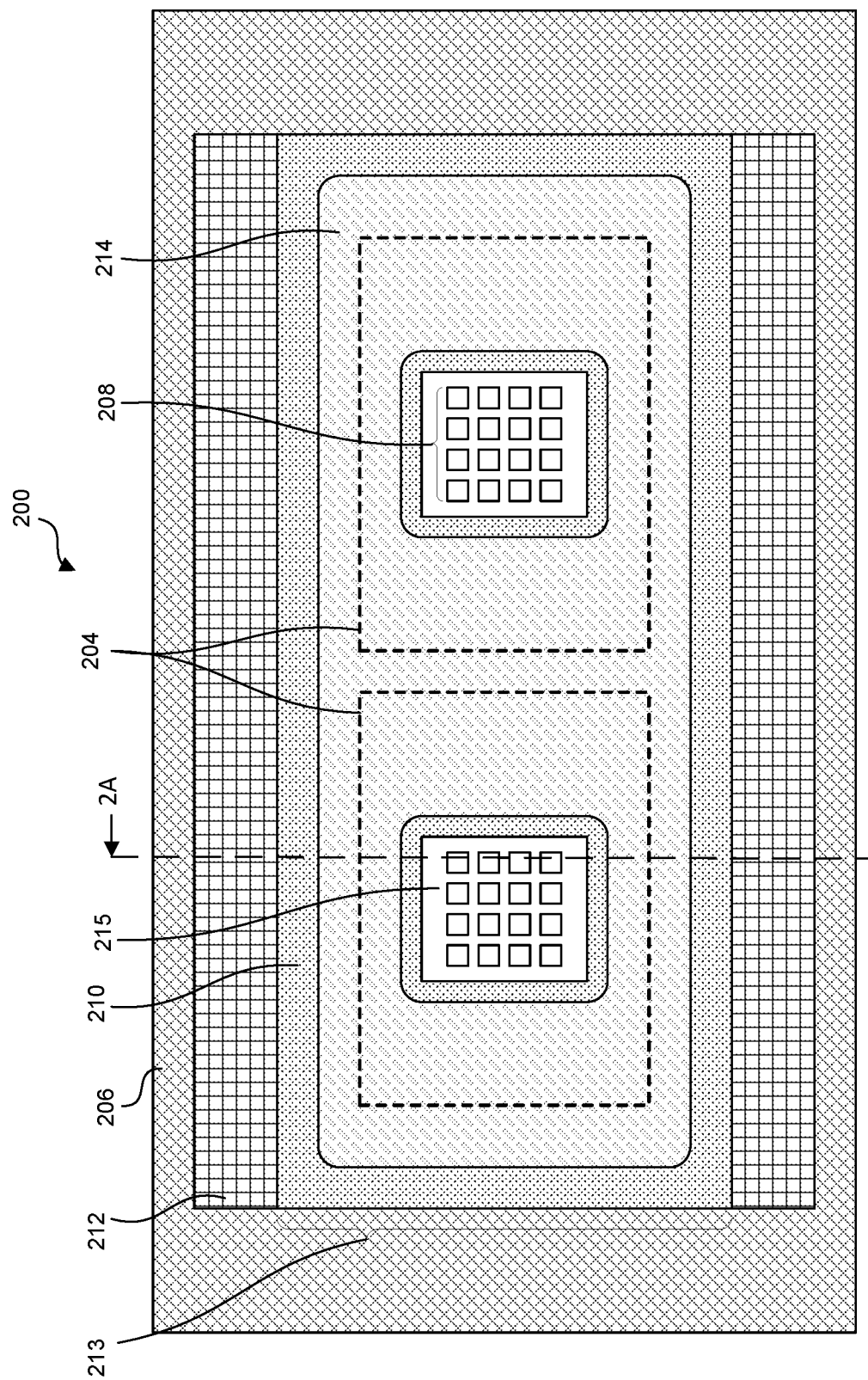
FIG. 2B is a schematic cross-sectional view of the semiconductor device assembly shown in FIG. 2A taken along line 2B-2B of FIG. 2A in accordance with embodiments of the technology.

FIG. 2A is a schematic cross-sectional view of a semiconductor device assembly 200 ("assembly 200") taken along line 2A-2A of FIG. 2B, and FIG. 2B is a schematic cross-sectional view of the semiconductor device assembly 200 shown in FIG. 2A taken along line 2B-2B of FIG. 2A in accordance with embodiments of the technology. Referring to FIG. 2A and FIG. 2B together, the assembly 200 can include a package configured for high-performance operations, such as 3-dimensional graphics processing and/or network processing. The assembly 200 can include a logic device 202 and a set of memory devices 204 mounted over a substrate 206 (e.g., a printed circuit board (PCB)). In some embodiments, the logic device 202 can include a graphics processing unit (GPU). In some embodiments, the memory devices 204 can include high-bandwidth memory (HBM) devices.

Figure 1A:
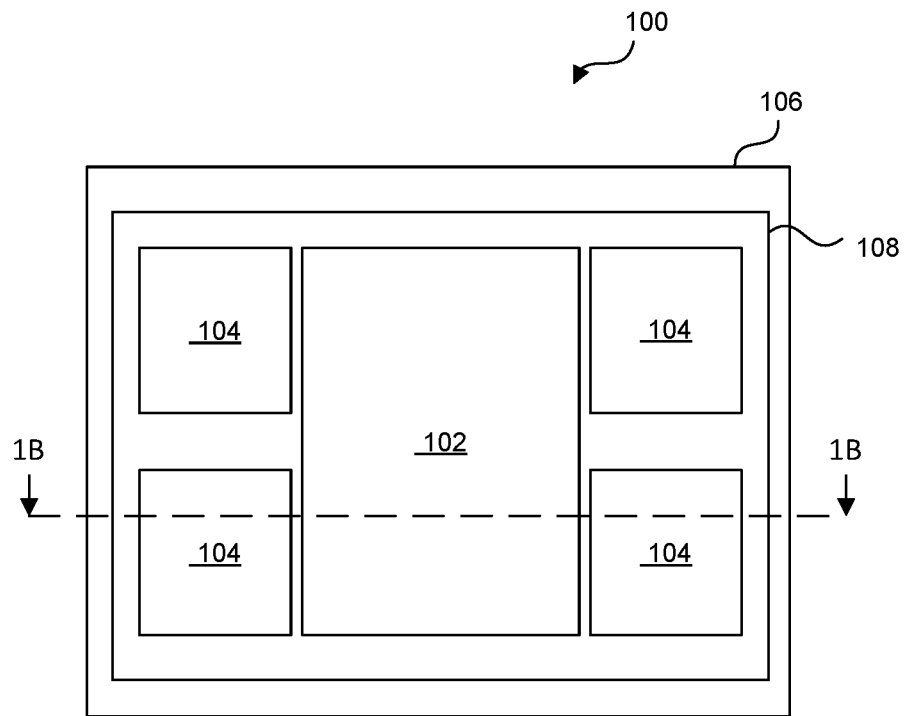
FIG. 1A is a top view of a conventional semiconductor device assembly.
Figure 1B:
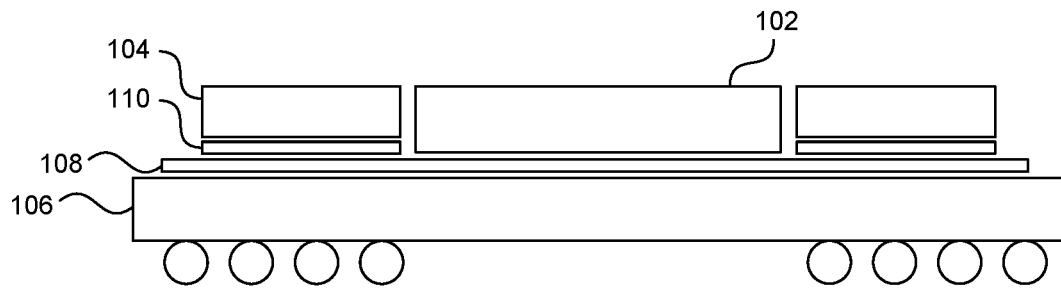
FIG. 1B is a schematic cross-sectional view of the conventional semiconductor device assembly shown in FIG. 1A taken along line 1B-1B of FIG. 1A.
Figure 1C:
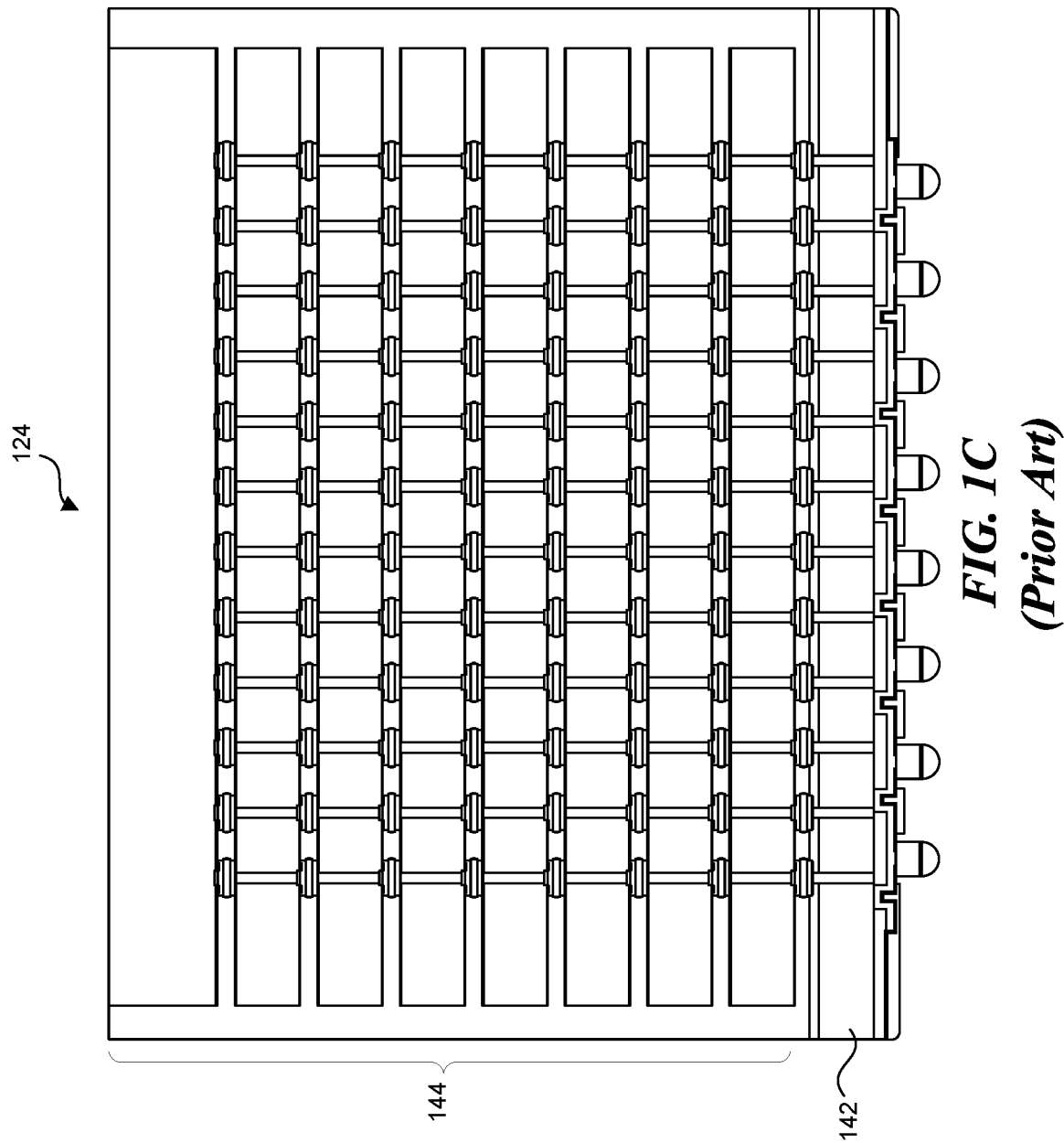
FIG. 1C is a detailed schematic cross-sectional view of a memory device.

As illustrated in FIG. 2A, the assembly 200 can include the memory devices 204, which can be mounted over the logic device 202. The memory devices 204 can overlap the logic devices 202, such as by being laterally within peripheral boundaries of the logic device 202. Accordingly, the lateral footprint of the assembly 200 (i.e., the footprint in the view of FIG. 2B) can be less than that of the conventional assembly 100 of FIG. 1A by eliminating laterally adjacent devices. The assembly 200 can also include vertical electrical connectors 208 (e.g., wires and/or conductive pillars) that electrically couple the memory devices 204 with the logic device 202.

The assembly 200 can include a thermal management system for reducing the heat transfer between the logic device 202 and the memory devices 204. For example, the thermal management system of the assembly 200 can include a thermally conductive layer 210 attached to a top surface of the logic device 202. In some embodiments, the thermally conductive layer 210 can include a graphene structure that includes carbon atoms arranged along one or more planar layers (e.g., arranged in a hexagonal lattice along a horizontal plane). Accordingly, the graphene structure can provide relatively efficient transfer (e.g., in comparison to metallic material) of thermal energy across a transverse plane relative to an upper surface 203 of the logic device 202 (e.g., a horizontal plane parallel to the upper surface 203 of the logic device 202). In one or more embodiments, the graphene structure can be attached to the logic device 202 using an adhesive 211. For example, the graphene structure can include one or more depressions or holes. In some embodiments, the adhesive 211 (e.g., epoxy or thermal interface material (TIM)) can be applied such that it fills the holes and contacts the structures above and/or below the graphene structure (e.g., the logic device 202, the memory devices 204, and/or an interposer). Accordingly, when the adhesive material is cured (via, e.g., heat, light, and/or chemical agents), the graphene structure can be at least partially encapsulated by the adhesive 211 and affixed relative to the vertically adjacent structures.

The thermal management system of the assembly 200 can also include a heat spreader 212 mounted over the logic device 202 and the memory devices 204. The heat spreader 212 can include a dissipation portion (e.g., fins) above the memory devices 204. The dissipation portion can be integrally connected to peripheral columns/walls that extend vertically and attach to (via, e.g., TIM or other thermally conductive adhesives) peripheral portions of the heat spreader 212. In some embodiments, the peripheral walls of the heat spreader 212 can be directly attached (via, e.g., direct contact and/or TIM) to a top surface of the thermally conductive layer 210 on peripheral portions thereof. In other embodiments, the peripheral walls of the heat spreader 212 can be directly attached to corresponding peripheral surfaces of the thermally conductive layer 210. As such, the thermal energy from the logic device 202 preferentially flows through the peripheral portions of the heat spreader 212 and is dissipated via the dissipation portion. Accordingly, the heat from the logic device 202 can be directed around the memory devices 204 using the thermally conductive layer 210 and the heat spreader 212, thereby reducing the heat transfer between the logic device 202 and the memory devices 204 (e.g., inhibiting heat generated by the logic device 202 from flowing to the memory devices 204).

In some embodiments, the heat spreader 212 can include an opening 213 (e.g., as shown in FIG. 2B) at least partially surrounded/defined by the peripheral walls of the heat spreader 212. For example, the opening can allow air to flow across the logic device 202 and/or the memory devices 204 to further remove thermal energy. In other embodiments, the peripheral walls of the heat spreader 212 can encircle/surround the memory devices 204 along a lateral plane. Accordingly, an amount of contact between the heat spreader 212 and the logic device 202 and/or the thermally conductive layer 210 can be increased.

As a further example of the thermal management system, the assembly 200 can include a thermal-insulation interposer 214 disposed between the logic device 202 and at least a portion of the memory devices 204. In some embodiments, the memory devices 204 can be directly attached to the thermal-insulation interposer 214, such as via a thermally insulative adhesive. In some embodiments, the thermal-insulation interposer 214 can be over the thermally conductive layer 210.

The thermal-insulation interposer 214 can include thermal insulators, such as glass or ceramic materials, and be configured to block and reduce heat transfer between the logic device 202 and the memory devices 204. The thermal-insulation interposer 214 can be superimposed directly under the memory devices 204 such that the memory devices 204 are located at least partially within the peripheral edges of the thermal-insulation interposer 214. In other words, the thermal-insulation interposer 214 can extend up to or beyond peripheral edges of the memory devices 204 (e.g., the memory devices 204 can be completely within a boundary defined by the lateral periphery of the thermal-insulation interposer 214). Accordingly, the thermal-insulation interposer 214 reduces or eliminates direct lines of sight between the logic device 202 and the memory devices 204 to block or at least impede (e.g., reduce) the heat generated by the logic device 202 from reaching the memory devices 204.

In some embodiments, the thermal-insulation interposer 214 can include a cavity 216 to further reduce the absorption or transfer of the thermal energy in or across the thermal-insulation interposer 214. For example, the cavity 216 can be under a vacuum condition. Also, the cavity 216 can be filled with insulative gases and/or PCM.

The thermal-insulation interposer 214 can include openings 215 through which vertical interconnects can pass to electrically connect vertically adjacent structures. For example, the electrical connectors 208 can be located within the openings 215. In some embodiments, the openings 215 of the thermal-insulation interposer 214 can be directly over (e.g., horizontally overlapping) the holes in the thermally conductive layer 210. In other embodiments, the openings of the thermal-insulation interposer 214 and the holes in the thermally conductive layer 210 can be horizontally offset, such as to eliminate any vertically direct line-of-sight between the logic device 202 and the memory devices 204. Accordingly, the electrical connectors 208 can include bends and/or can be aligned diagonally to pass through the openings of the thermal-insulation interposer 214 and the holes in the thermally conductive layer 210.

Figure 3:
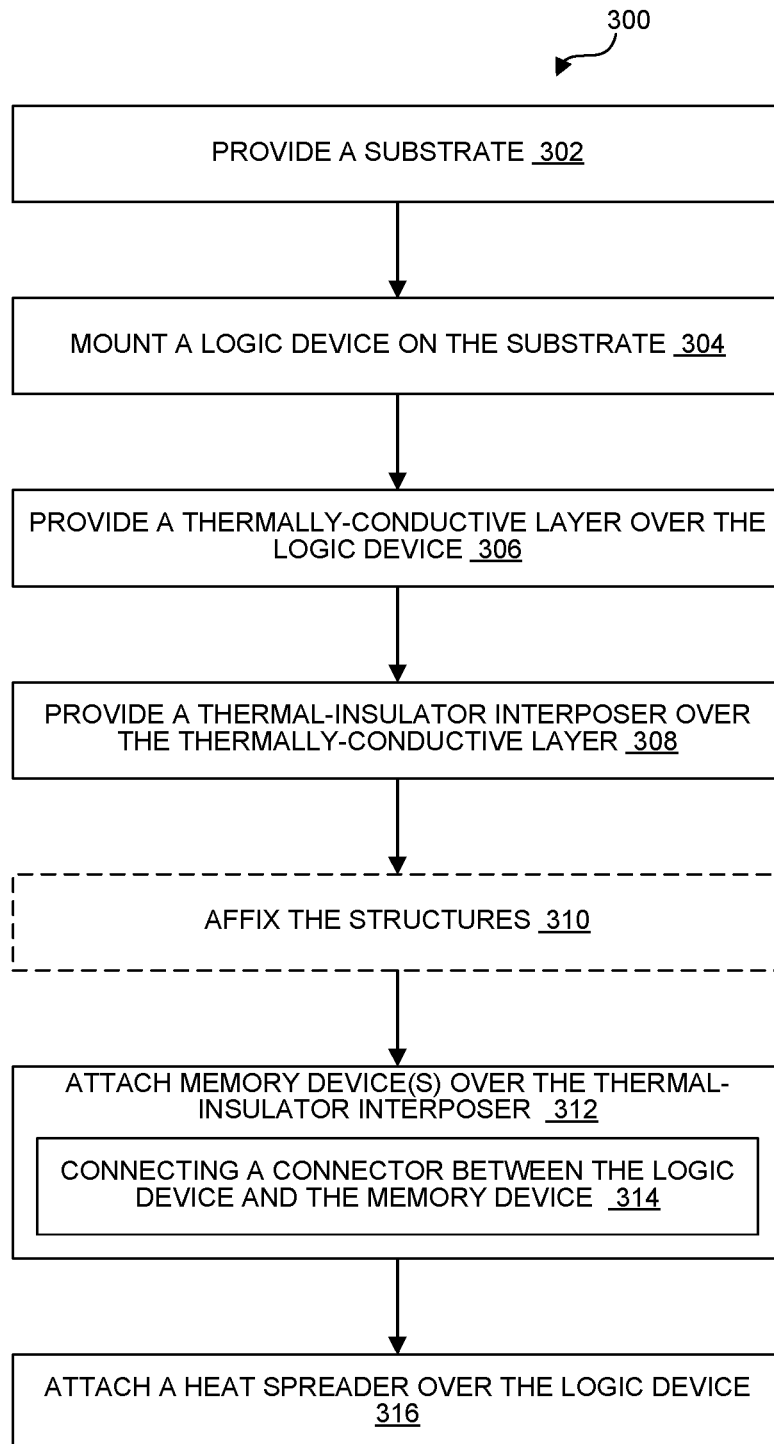
FIG. 3 is a flow chart illustrating a method of manufacturing a semiconductor device assembly in accordance with embodiments of the technology.

FIG. 3 is a flow chart illustrating a method 300 of manufacturing a semiconductor device assembly in accordance with embodiments of the technology. The method 300 can be for manufacturing the semiconductor device assembly including a set of stacked semiconductor devices with a thermal management configuration for preventing heat transfer between the devices. For example, the method 300 can be for manufacturing the assembly 200 of FIG. 2A.

At block 302, a substrate (e.g., the substrate 206 of FIG. 2A) can be provided. For example, a PCB can be provided. At block 304, a logic device (e.g., the logic device 202 of FIG. 2A) can be mounted on the substrate. For example, a GPU can be directly attached to a top surface of the substrate based on reflowing solder and/or curing an adhesive disposed between the GPU and the substrate.

At block 306, a thermally conductive layer (e.g., the thermally conductive layer 210 of FIG. 2A) can be provided over the logic device. Continuing with the above example, a graphene structure can be placed over the GPU. A thermally conductive adhesive material (e.g., epoxy and/or TIM) can be applied below, above, and/or within holes of the graphene structure. The adhesive material can be later cured to affix the graphene structure to the GPU. Accordingly, the graphene structure can directly contact the GPU through the thermally conductive adhesive and draw thermal energy out of the GPU. As described above, the graphene structure can be configured to transfer the thermal energy along a plane (e.g., horizontally as shown in FIG. 2A).

At block 308, a thermal-insulator interposer (e.g., the thermal-insulation interposer 214 of FIG. 2A) can be provided over the thermally conductive layer and the logic device. As shown in FIG. 2B, a thermally insulative structure (e.g., glass, ceramic, etc.) can be placed over the thermally conductive layer. Along directions (e.g., in a plane parallel to the top surface 203 of the logic device 202), the thermal-insulator interposer can extend up to, without extending beyond, peripheral edges of the thermally conductive layer. In some embodiments, the thermally insulative structure can contact the thermally conductive adhesive described above. Accordingly, as illustrated at block 310, various structures (e.g., the logic device, the graphene structure, and/or the thermally insulative interposer) can be affixed relative to each other. In other words, the thermally conductive adhesive can be cured (via, e.g., chemical agents, light, temperature, etc.), thereby affixing the structures contacting the adhesive.

At block 312, one or more memory devices (e.g., the memory devices 204 of FIG. 2A) can be attached over the thermal-insulator interposer and the logic device. In some embodiments, the memory devices can be attached directly (via, e.g., adhesive material) to the thermal-insulator interposer. In some embodiments, attaching the memory devices can include electrically coupling the memory devices to the logic device. At block 314, one or more connectors (e.g., the vertically extending electrical connectors 208 of FIG. 2A) can be connected to the memory devices and/or the logic device. In some embodiments, the memory devices and/or the logic devices can be provided with conductors (e.g., wires and/or metallic columns) attached thereto. The thermally conductive layer and/or the thermal-insulator interposer can be provided with holes and/or openings therein. When placing/attaching the structures, the conductors can be placed within the holes and/or the openings. Accordingly, the thermal-insulator interposer and/or the thermally conductive layer can surround the conductors along a horizontal plane. The conductors can extend through the holes/openings and vertically across the thermally conductive layer and/or the thermal-insulator interposer, and thereby extend between the logic device and the memory devices. The conductors can be connected, such as based on reflowing solder, to the memory devices and the logic devices.

In some embodiments, the openings/holes in the thermally conductive layer and the thermal-insulator interposer can be aligned. In other embodiments, the openings/holes in the thermally conductive layer and the thermal-insulator interposer can be offset such that the holes/openings are not concentric or directly over each other, thereby reducing and/or eliminating a direct line-of-sight between the memory devices and the logic device. The conductors can extend, at least partially, along a horizontal direction based on the offset.

At block 316, a heat spreader/sink (e.g., the heat spreader 212 of FIG. 2A) can be attached over the logic device 202. The heat spreader 212 can include the dissipation portion and vertical portions. The heat spreader 212 can be placed such that the dissipation portion is over the memory devices 204 with the vertical portions horizontally adjacent to the peripheral sides of the memory devices 204. The vertical portions of the heat spreader 212 can vertically extend past/across the thermal-insulator interposer 214, and they can be attached to the thermally conductive layer. In some embodiments, the vertical portions of the heat spreader 212 can be attached (via, e.g., TIM) to a top surface of the thermally conductive layer. In other embodiments, the vertical portions of the heat spreader 212 can be attached to corresponding peripheral surface portions of the thermally conductive layer.

Accordingly, the thermal management system described above reduces and/or prevents heat transfer between vertically stacked devices. As such, the assembly 200 can include the memory devices 204 (e.g., the HBM devices) mounted over the logic device 202 (e.g., the GPU) without the heat from the logic device 202 affecting the memory devices 204 or vice versa. Thus, the assembly 200 can provide a reduced footprint in comparison to conventional assemblies (e.g., the assembly 100 of FIG. 1A) while reducing heat transfer between the logic device 202 and the memory devices 204.

Figure 4:
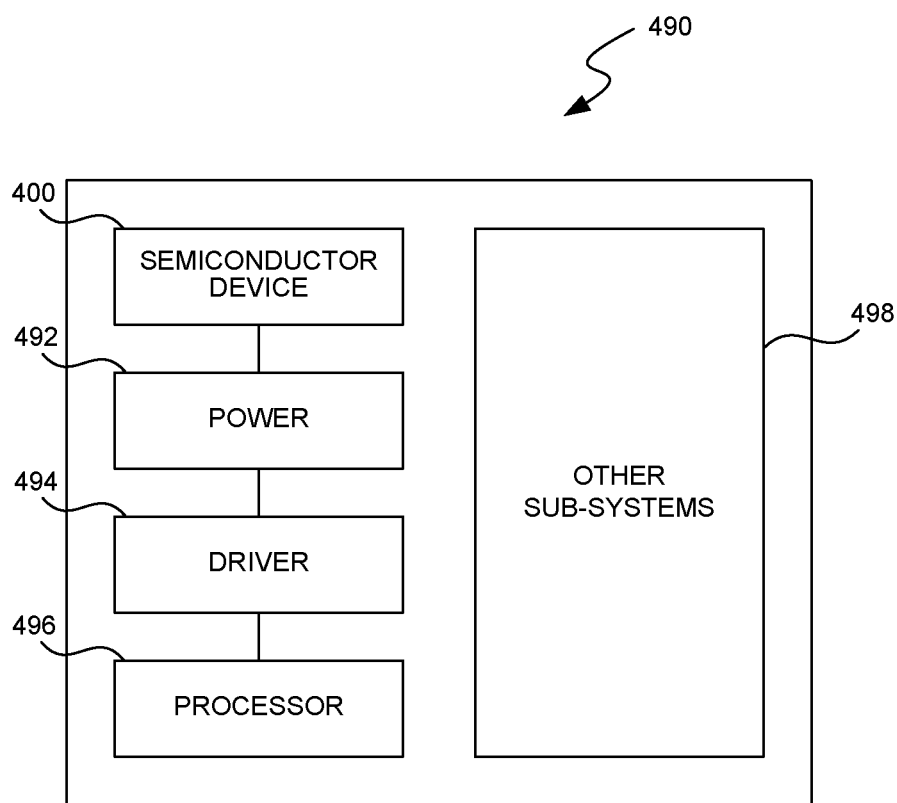
FIG. 4 is a schematic view of a system that includes a semiconductor assembly configured in accordance with embodiments of the present technology.

Any one of the semiconductor devices described above with reference to FIGS. 2A-3 can be incorporated into any of a myriad of larger and/or more complex systems, a representative example of which is system 490 shown schematically in FIG. 4. The system 490 can include a semiconductor device 400 ("device 400") (e.g., a semiconductor device, package, and/or assembly), a power source 492, a driver 494, a processor 496, and/or other subsystems or components 498. The device 400 can include features generally similar to those devices described above. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, and appliances. Components of the system 490 may be housed in a single unit or distributed over multiple, interconnected units (e.g., through a communications network). The components of the system 490 can also include remote devices and any of a wide variety of computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," and "having" are used throughout to mean including at least the recited feature(s) such that any greater number of the same feature and/or additional types of other features are not precluded. Reference herein to "one embodiment," "an embodiment," "some embodiments" or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:

1. A semiconductor assembly, comprising:
    a first device;
    a second device mounted overlapping the first device;
    a thermal management layer disposed between the first device and the second device,
        wherein the thermal management layer is statically and structurally configured to reduce transfer of thermal energy between the first device and the second device, and
        wherein the thermal management layer includes an opening defined by inner edges of the thermal management layer; and
    a connector electrically coupling the first and second devices, wherein the connector extends through the opening in the thermal management layer and spaced apart from the inner edges.

2. The semiconductor assembly of claim 1, wherein the first device is a logic device.

3. The semiconductor assembly of claim 2, wherein the first device is a graphics processing unit (GPU).

4. The semiconductor assembly of claim 1, wherein the second device is a memory device.

5. The semiconductor assembly of claim 4, wherein the memory device is a high-bandwidth memory (HBM) device.

6. The semiconductor assembly of claim 1, wherein the thermal management layer includes a thermal-insulator interposer configured to reduce heat transfer between the first and second devices.

7. The semiconductor assembly of claim 6, wherein the thermal-insulator interposer includes ceramic, glass, or a combination thereof.

8. The semiconductor assembly of claim 6, wherein the thermal-insulator interposer includes a cavity.

9. The semiconductor assembly of claim 8, wherein the cavity is configured to maintain a vacuum condition within the cavity.

10. The semiconductor assembly of claim 8, wherein the thermal-insulator interposer includes a gas and/or a phase change material (PCM) within the cavity.

11. A semiconductor assembly, comprising:
    a first device;
    a second device mounted overlapping the first device;
    a thermal management layer disposed between the first device and the second device,
        wherein the thermal management layer is statically and structurally configured to reduce transfer of thermal energy between the first device and the second device; and
    a connector electrically coupling the first and second devices, wherein the connector extends across the thermal management layer,
    wherein the thermal management layer includes a thermally conductive layer configured to transfer the thermal energy across a lateral plane.

12. The semiconductor assembly of claim 11, wherein the thermally conductive layer is a graphene structure.

13. The semiconductor assembly of claim 11, wherein the connector extends vertically across the thermal management layer.

14. The semiconductor assembly of claim 13, further comprising:
a further connector electrically coupling the first and second devices, wherein:
the connector and the further connector extend through the opening.

15. A semiconductor assembly, comprising:
a first device;
a second device mounted overlapping the first device;
a thermal-insulator interposer disposed between the first and second devices,
wherein the thermal-insulator interposer is statically and structurally configured to reduce transfer of thermal energy between the first and second devices, and
wherein the thermal-insulator interposer includes an opening defined by inner edges of the thermal-insulator interposer; and
connectors electrically coupling the first and second devices, wherein the connectors extend through the opening in the thermal-insulator interposer and spaced apart from the inner edges.

16. The semiconductor assembly of claim 15, further comprising:
a graphene layer configured to transfer the thermal energy across a lateral plane; and
a heat spreader mounted over the first and second devices and thermally coupled to the graphene structure, the heat spreader configured to disperse the thermal energy from the first and/or the second devices.

17. A semiconductor assembly, comprising:
a first device;
a second device mounted overlapping the first device;
a graphene structure disposed between the first and second devices, wherein the graphene structure is configured to reduce transfer of the thermal energy between the first and second devices; and
a connector electrically coupling the first and second devices, wherein the connector extends across the graphene structure.

18. The semiconductor assembly of claim 17, wherein:
the graphene structure includes a hole; and
the vertically extending connector extends through the hole.

19. The semiconductor assembly of claim 17, wherein:
the graphene structure is configured to transfer thermal energy across a lateral plane; and
further comprising:
a heat spreader coupled to the graphene structure and configured to disperse the thermal energy from the graphene structure.

* * * * *